United States Patent
Wilson

(10) Patent No.: US 7,120,396 B2
(45) Date of Patent: Oct. 10, 2006

(54) RADIO TRANSMITTER ARCHITECTURE COMPRISING A PLL AND A DELTA-SIGMA MODULATOR

(75) Inventor: Martin Wilson, Highfields (GB)

(73) Assignee: Cadence Design Systems Inc. of San Jose, San Jose, CA (US)

( * ) Notice: Subject to any disclaimer, the term of this patent is extended or adjusted under 35 U.S.C. 154(b) by 353 days.

(21) Appl. No.: 10/664,164

(22) Filed: Sep. 17, 2003

(65) Prior Publication Data

US 2004/0196924 A1 Oct. 7, 2004

Related U.S. Application Data

(63) Continuation of application No. 10/088,670, filed on Mar. 21, 2002, now abandoned.

(51) Int. Cl.
*H04B 1/02* (2006.01)
*H03C 3/00* (2006.01)

(52) U.S. Cl. .............. 455/108; 455/101; 455/126; 455/112; 375/302

(58) Field of Classification Search ............... 455/101, 455/108, 112, 126, 119, 76; 375/302, 289, 375/300; 341/143, 144
See application file for complete search history.

(56) References Cited

U.S. PATENT DOCUMENTS

| | | | | |
|---|---|---|---|---|
| 5,337,024 A | * | 8/1994 | Collins | 455/76 |
| 6,784,817 B1 | * | 8/2004 | Matsuura et al. | 375/302 |
| 6,809,669 B1 | * | 10/2004 | Robinson | 341/144 |
| 6,920,182 B1 | * | 7/2005 | Bolton, Jr. | 341/143 |
| 2003/0157905 A1 | * | 8/2003 | Holmqvist | 455/102 |
| 2004/0038648 A1 | * | 2/2004 | Matsuura et al. | 455/101 |

* cited by examiner

*Primary Examiner*—Lana Le
(74) *Attorney, Agent, or Firm*—Kenyon & Kenyon LLP

(57) ABSTRACT

The transmitter circuit architecture is disclosed based on a phase lock loop architecture and which uses a delta-sigma modulator with 2 point modulation. In order to restrict the bandwidth of the PLL, subsidiary analogue modulation is employed, which requires aligning with the delta-sigma modulation. Alignment of the modulation is accomplished by correction of the sensitivity of the PLL voltage controlled oscillator to modulation by correlating residual modulation in the PLL with the modulated signal input. The action of the modulation correlator trims the modulation and the PLL bandwidth without disturbing the normal operation of the transmitter, and allows the use of modulation bandwidths greater than the PLL bandwidth.

17 Claims, 6 Drawing Sheets

RADIO TRANSMITTER ARCHITECTURE COMPRISING A PLL AND A DELTA-SIGMA MODULATOR

CROSS REFERENCES TO RELATED APPLICATIONS

This application is a continuation of application Ser. No. 10/088,670 filed Mar. 21, 2002 now abandoned.

The present invention relates to a transmitter architecture for use in radio telecommunications, and more particularly to a transmitter architecture which is suitable for use with mobile transmitters which may employ both constant and non-constant envelope modulation schemes.

There is a trend in the mobile communications market towards producing smaller, lower cost devices which possess the ability to perform multiple mode operation to support both constant and non constant envelope modulation schemes. Such a device is most likely to be realised by integrating more of the transceiver parts onto silicon and preferably including the various voltage-controlled oscillators (VCOs) within the integrated circuit. However, the integration of oscillators onto silicon is likely to result in an increased tolerancing uncertainty of the control voltage sensitivity, and this sensitivity would be very difficult to measure in an integrated oscillator. It may be possible to overcome this problem by use of an oscillator with variable control voltage gain, however such a variable gain oscillator would severely compromise synthesiser performance.

Multiple mode operation as referred to above means the ability to support both constant and non-constant amplitude envelope modulation schemes. All modulation schemes can be represented on a complex plot known as a constellation diagram with the instantaneous amplitude and phase of the carrier represented by a modulation vector. With constant envelope schemes all points of the diagram will be equidistant from the centre. However, with non constant envelope modulation systems there will be trajectories that approach the centre of the diagram. The phase of the modulated signal will be represented by the angle of the modulation vector to the diagram centre. The rate of change of this angle represents the bandwidth of the resulting phase modulated signal. With trajectories of the modulation vector that approach the centre, the rate of change of the above described angle and therefore the modulation bandwidth will increase over that of the constant envelope schemes.

Until recently, a majority of digital radio communications devices used constant amplitude phase modulation schemes such as Gaussian minimum shift keying (hereinafter referred to as GMSK), and frequency modulation such as Gaussian Frequency shift keying, (hereinafter GFSK). GFSK is not particularly critical in terms of its transmitter requirements, and therefore it is possible to use simple architectures (eg single loop PLL synthesised LO with the transmitter oscillator in free run mode during transmit). To the contrary, however, wireless communications systems using phase modulation schemes such as GMSK are altogether more exacting in transmit architecture requirements and therefore simple GFSK transmit architectures are not suitable.

In order to provide suitable GMSK transceivers, initial transmit architectures for GMSK modulation schemes consisted of modulation at an IF followed by upconversion to RF. This required bulky and lossy filtering to be placed after the transmitter to protect the RX band from noise present at the output of the transmitter. The next evolution of constant envelope radio communication devices using phase modulation relied on the use of a phase locked loop, as shown in the prior art configuration of FIG. 1, and described in more detail next.

FIG. 1 shows a prior art upconversion loop modulator as described in U.S. Pat. No. 5,511,236 and which is presently in common use throughout the industry. The output frequency of the Tx is determined by the following formula:

$$TX_{out} = F_{lo1} + F_{lo2} \cdot \frac{N_l}{N_r}$$

Where Nr is the division ratio of the reference divider (3) and N1 is the division ratio of the IF divider (13) A Phase detector (4) ensures that the divider outputs 3 and 13 are maintained at the same frequency. The first (Lo1(9)) and second (Lo2(1)) local oscillator signals are each synthesised from the reference crystal. Lo1 is level translated by a level adjuster (2) in order to drive digital logic. Lo1 (9) is not at the transmitter output frequency, and therefore is insensitive to PA pulling effects and a low BW large division ratio synthesiser is typically used in the prior art. Lo1 is principally set to determine the output frequency. Modulation is applied by the analogue IQ modulator (12) at the IF within the feedback loop. The IF is in turn generated by means of a downconversion mixer (8). After modulation the IF is passed to the phase detector after division. The Phase detector controls the TX LO (7) through the loop filter (6) that determines the loop dynamics. The TX LO is used to generate the transmit signal which in tun drives the power amplifier and the antenna. The IF filter (10) removes spurious mixing products and the post modulation filter (11) removes spurious signals from the modulator output.

There must be sufficient PLL bandwidth to transfer modulation introduced at (12) to the TX oscillator (7) without distortion. There are many analogue stages in the loop, each of which will degrade the phase accuracy of the modulation. The PLL response to modulation will add extra overall degradation. The net result is a high residual phase error with a spread as a result of manufacturing tolerances on the analogue components. The PLL is a negative feedback loop with an open loop response determined by:

$$H_{ol}(s) = K_{pd} \cdot LF(s) \cdot \frac{K_{vco}}{s} \cdot \frac{1}{N_l}$$

where Kpd, the phase detector gain, and Kvco, the vco control signal gain, hereafter referred to as Kvco are subject to substantial production spreads. Large design margins must be allowed to ensure lock time and noise targets are met. This configuration acts as an effective filter for the transmit components in the RX band, but also possesses a number of significant drawbacks. In particular, some of the identified drawbacks are as follows:

a) Increased modulation error due to the multiple analogue contributions to the error;
b) The use of multiple VCOs increases the cost of materials and poses screening and frequency planning problems;
c) The use of a synthesiser with low reference comparison frequency increases switching time;
d) The architecture is restricted to constant envelope schemes;

e) Careful frequency planning is required for multi-band operation; and f) Increased complication for multi mode GFSK/GMSK devices over that required for GFSK alone.

With regards to using the existing GMSK architecture in a non-constant amplitude envelope modulation scheme, one such method is to resolve the baseband modulation into its amplitude and phase components. This means that the constant envelope modulation architectures can be used to provide the phase component, and a separate amplitude modulating circuit be used at the TX output. In this way, the constant envelope modulator can be used in a dual mode constant envelope/non constant envelope system. However, as described previously, the increased modulation bandwidth required for non-constant envelope modulation schemes can represent a serious problem if the presently used GMSK architecture such as the upconversion loop is used in a multi mode transmitter. As implemented in FIG. 1 the upconversion loop architecture requires that the PLL bandwidth be substantially higher than that of the modulation, thus imposing a severe requirement on the PLL.

The alternatives to using an upconversion loop such as that shown in FIG. 1 are either to return to the original mixer direct upconversion architecture, or provide a means of modulating the PLL that can support the increased modulation bandwidth.

One such option is to use dual point modulation. The aim of dual point modulation is to make the overall modulation transfer function independent of the PLL transfer function. In this case, the modulation bandwidth is unrestricted by the PLL bandwidth and wide bandwidth modulation is possible. A dual modulation Tx architecture of the prior art is shown in FIG. 2.

FIG. 2 shows a prior art dual modulation TX architecture as disclosed in U.S. Pat. No. 4,052,672. In this case the downconversion mixer and first local oscillator LO1 is eliminated by use of a frequency divider (13).

Referring to FIG. 2, the modulation is output from the baseband source (14) as a FM representation and summed with the PLL loop filter (6) output by summing means (18), before being output directly onto the Tx oscillator (7) control input. The same representation of the modulating signal is applied to an integrator (15) in order to apply this as phase modulation by modulation charge pump (16) to the phase detector output (5) by summing means (17). The aim is to completely remove all components of the modulation at the output of 17.

The use of a large division ratio for the VCO divider (13) raises the noise floor and necessitates the use of a narrow PLL bandwidth to meet the noise and error vector requirements of digital radio communications systems.

The need to use a low loop bandwidth imposes a severe restriction on the use of this architecture since the VCO (7) is at the same frequency as the antenna and is therefore subject to substantial pulling. Also, the two modulation inputs are applied by analogue means, and are therefore subject to production spreads, rendering this unsuitable for a modulation scheme such as GMSK that demands precision. In addition, with respect to dual point modulation generally, if the modulation is not applied equally at both points in the loop, a residual component of the modulation would be subject to the transfer function of the PLL. The modulation would then be subject to some distortion. Additionally, a common problem with PLL synthesisers is that the PLL dynamics are subject to large tolerance spreads in the individual gain parameters of the sub blocks in the PLL. This will compromise noise performance and switching time, both of which are key parameters in modern higher data rate radio communications systems.

In further prior art architectures, the IQ modulator commonly used in upconversion loops can be replaced by a phase modulator or frequency modulator if constant envelope modulation is to be applied. If phase modulation is used, it can in principal be transformed into frequency modulation by integration. There is, however, a fundamental difference in the precision required of the frequency modulator between phase and frequency modulation. In the case of GFSK, the limits on the frequency deviation are set by the requirements of the particular transmission standard used and are not particularly severe. For GMSK modulation, the frequency deviation must be accurately maintained at quarter data rate to prevent large phase errors. If phase modulation is to be used, then only digital techniques can in practice guarantee sufficient precision. The same applies to non constant envelope schemes such as N-PSK or W-CDMA where low phase errors are essential to maintaining low error vector magnitude. A known architecture employing digital techniques which provides the sufficient precision is shown in FIG. 3.

FIG. 3 shows a further prior art modulation architecture which makes use of a delta sigma modulator as a FM modulation means inside a PLL, as disclosed in U.S. Pat. No. 4,994,768. With reference to FIG. 3, the Tx architecture consists of a synthesiser PLL loop consisting of identical blocks (1) to (7) as already described above for FIGS. 1 and 2, but with the division ratio N of the divider (13) changed on a reference cycle by cycle basis. The delta sigma modulator (24) oversamples and noise shapes the modulation in a manner well known in the art. A programmable constant P (26) provided from a memory or the like offsets the divider to the nearest integer multiple of the reference frequency and adds this by summing means (25) to the delta sigma output. A second programmable constant F (22) provides a fractional offset to the modulation by summation means (23) to select the output channel.

The instantaneous frequency of the synthesiser is determined by:

$$F_{synth}(t) = f_{mod}(t) + \left(\frac{F}{2^w} + P\right)f_{ref}$$

where w is the bus width of the arithmetic units in the delta sigma section.

The advantage of the delta sigma modulation method is:

1) The modulation is applied in the digital domain so precision is implicit in the process.

2) Low division ratios for N can be used, therefore substantially reducing the phase detector and divider noise contribution to the synthesiser output.

3) The use of noise shaping results in the quantisation noise being moved outside of the loop bandwidth.

4) Although quantisation noise will be present in and around the transmit channel, the level is entirely deterministic and therefore not subject to production spreads.

The use of a delta sigma modulator enables sufficient precision to guarantee low errors when used with GMSK or the non constant envelope schemes. An essential feature of the present invention is that use is made of the precision capability of the delta sigma modulator, as will become apparent later.

The disadvantages of the delta-sigma method of modulation used alone are that:
  i) There is a lower limit on the PLL loop bandwidth as mentioned above for the upconversion loop, the high PLL bandwidth may cause excessive adjacent channel emissions at the TX output; and
  ii) The PLL is still subject to large variations in loop bandwidth due to component tolerancing.

Note, however, that the use of a delta sigma modulator does guarantee precision for the low frequency information content of the modulation.

FIG. 4 shows a further prior art architecture which overcomes the above two problems, and which was disclosed in U.S. Pat. No. 5,729,182. Note that in the following discussion the same reference numerals are used to refer to like features common with those architectures previously described above with reference to FIGS. 1, 2 and 3.

With reference to FIG. 4, the integrator (15) provides a modulation that subtracts the effect of modulating the oscillator (7) by means of modulating the charge pump (16) at the summation means (17) as with the architecture shown in FIG. 2. This describes a simple fractional N with analogue interpolation for the modulation. When the phase trajectory exceeds the 2*pi boundary, divider N (13) is either incremented or decremented to swallow or add one cycle of vco phase to the VCO divider. In order to track the scaling of the modulation paths and minimise the residuals in the PLL, the modulation is subject to the identical transfer function as that of the PLL, and the two are correlated by multiplication in the correlator (20). If the VCO gain (Kvco) is too large, the PLL will have a modulation residual in phase with the applied modulation filtered by PLL transfer fiction filter (19) and a positive correlation value will result from the correlator (20). If the VCO modulation is too low, the waveforms at the correlator (20) will be in antiphase, and a negative correlation will result. The output from the correlator (20) can therefore be used to either increment or decrement the scaling of the gain controller in 21. This is a major advance upon previous architectures in that the PLL loop-bandwidth/modulation-bandwidth link is no longer mandatory. The PLL loop bandwith can therefore be chosen to give the optimum trade off between settling time and phase detector/divider noise contribution. U.S. Pat. No. 5,729,182 also mentions the possibility that the modulation may be applied from a delta sigma, but does not indicate how to use the delta sigma in order to ensure the precision of the modulation. Without the use of a delta sigma some form of either analogue interpolation or modulation would be required. In the case of analogue interpolation, the correlation must be carried out over a longer time period in order to realise the precision of the fractional N modulation. Consequently, the only way to ensure correct operation of the correlator is to mirror the PLL response with filter (19).

Even in view of the above advantages of the correlation approach described above, the following significant problems still remain with the prior art:
  i) The PLL response must be mirrored by the filter (19). Both the PLL and its mirrored response are still subject to production spreads as discussed above, and further variations would be required for different bands, operating modes etc. Tracking this with filter 19 represents major practical problems especially if the transmitter is to be integrated;
  ii) The removal of DC from the correlator input requires substantial extra circuitry including an analogue to digital converter;
  iii) Spreads in VCO gain will result in spreads in the PLL dynamics which will have a detrimental effect on PLL settling time/noise contribution from the dividers and detectors. This is due to uncertainties in the PLL open loop phase margin increasing closed loop noise peaking and lengthening the PLL step response time.

SUMMARY OF THE INVENTION

It is an object of the present invention to provide a transmitter circuit means capable of a high level of integration for use in a highly integrated transceiver.

It is another object of the present invention to provide a transmitter circuit means which allows for repeatable modulation precision, and which allows a variety of modulation formats used in radio communications systems to be accommodated.

In order to meet the above objects, and to provide precision modulation requiring no trimming, the present invention employs a delta sigma modulator together with 2 point modulation. In order to restrict the bandwidth of the PLL, subsidiary analogue modulation has to be used. This has to be aligned to match up with the delta sigma modulation. The trimming of the loop to align the modulation is accomplished by correction of the voltage controlled oscillator sensitivity to modulation by correlating residual modulation in the PLL with the modulated signal input. Ideally, the modulation should be filtered with a filter programmed with the PLL response. However, since the PLL response would not be known at initial PLL lock, the modulation correlation loop may be especially designed to operate without a known PLL response. The action of the modulation correlator trims the modulation and the PLL loop bandwidth without disturbing the normal operation of the transmitter.

In view of the above, according to the present invention there is provided a transmitter circuit means comprising:
  a phase lock loop including a phase detector means, a summation means, and a voltage controlled oscillator arranged in series, and a controllable frequency divider arranged to feedback an output of the voltage controlled oscillator to an input of the phase detector; and
  a baseband modulation source arranged to generate a modulation signal corresponding to information to be transmitted;
  said transmitter circuit means being characterised by further providing:
  a modulation correlation circuit means arranged to receive said modulation signal and to correlate said signal with residual modulation in the phase lock loop to generate one or more modulation correction signals;
  a delta-sigma modulator means arranged to receive said modulation signal and generate a delta-sigma control signal therefrom; and
  a modulation amplitude scaling means arranged to receive the modulation signal and the modulation correction signal and to scale the amplitude of the modulation signal in response thereto;
  wherein the scaled modulation signal is applied to the phase lock loop at the summation means in order to modulate the voltage controlled oscillator to produce a modulated RF output signal; and
  the delta-sigma control signal is applied to the controllable frequency divider in order to control the divide ratio thereof whereby the controllable frequency divider acts to substantially remove the modulation from the modulated RF output signal at the input to the phase detector.

Furthermore, the present invention also provides a method for generating a modulated RF output signal in a phase lock loop including a phase detector means, a summation means and a voltage controlled oscillator arranged in series and a controllable frequency divider arranged to feedback an output of the voltage controlled oscillator to an input of the phase detector, the method comprising the steps of:

generating a modulation signal corresponding to information to be transmitted; and characterised by further comprising the steps of:

generating a delta-sigma control signal from the modulation signal in a delta-sigma modulator;

applying the modulation signal to the summation means to modulate the voltage controlled oscillator to produce the modulated RF output signal as the output of said oscillator;

applying the delta-sigma control signal to the controllable frequency divider in order to control the frequency divide ratio thereof;

frequency dividing the modulated RF output signal in the controllable frequency divider in accordance with the frequency divide ratio of the divider;

correlating residual modulation in the phase lock loop with the modulation signal, the result of the correlation being used to generate a modulation correction signal; and scaling the modulation signal applied to the summation means in response to the modulation correction signal, wherein said step of frequency dividing substantially removes the modulation from the RF output signal at the input to the phase detector.

The transmitter circuit means preferably further comprises a reference frequency source arranged to generate a reference frequency signal, the phase detector means being arranged to receive the reference frequency signal at a second input, and to compare the reference frequency signal with the output RF signal from the controllable frequency divider to generate a phase error signal corresponding to the relative phase error therebetween in a preferred embodiment, the phase detector means further comprises a charge pump arranged to provide a certain amount of charge in response to the detected phase error, and charge pump scaling means are further provided arranged to control the charge pump to scale the amplitude of the phase error signal generated therein, the charge pump scaling means being responsive to a charge pump correction signal generated by the modulation correlation circuit means. Control of the charge pump provides further control of the residual modulation in the phase lock loop, thereby allowing the dual point modulation to be more accurately aligned.

In a preferred embodiment the modulation correlation circuit means further comprises a differentiator arranged to receive the phase error signal from the phase detector means and to differentiate the signal to give a frequency deviation signal. In addition, a high pass filter arranged to receive the modulation signal from the baseband modulation source filters the modulation signal to remove any low frequency components, and the filtered modulation signal is passed through a correlator which correlates the filtered modulation signal with the frequency deviation signal to output a master control signal. Control signal generation means are then further provided arranged to receive the master control signal and to generate at least the modulation correction signal used to control the modulation amplitude scaling means. In the preferred embodiment including the charge pump scaling means, the control signal generation means also generates a charge pump correction signal which controls the charge pump to scale the phase error signal generated therein. An advantage of the modulation correlation circuit means of the preferred embodiment incorporating a high pass filter is that by correlating the high frequencies only, the effect on the phase lock loop bandwidth is substantially reduced and the correlator will correct errors much more rapidly than if a long sequence of modulation is required. In this way, even more effective alignment of the dual point modulation can be obtained.

It is an advantage of the present invention that the phase lock loop consists of a single loop with reference and transmitter oscillators only. This is because an integrated VCO is likely to sufferer from considerable tolerancing uncertainties in tuning voltage sensitivity, and the use of a single loop can minimise the effect of such uncertainties.

It is a further advantage of the present invention that by allowing the use of modulation bandwidths greater than the PLL bandwidth, the present invention may be used to provide the phase modulated component of non constant envelope modulation modes. This can be achieved with a level of complication comparable with a GFSK synthesiser, thereby enabling an architecture capable of realising low cost multi-mode operation.

Further features and advantages of the present invention will become apparent from the following description of a particularly preferred embodiment thereof, presented by way of example only, and by reference to the accompanying drawings, wherein like parts are denoted by like reference numerals, and wherein.

A particularly preferred embodiment of the present invention will now be described with reference to FIG. 5.

Figure 4:
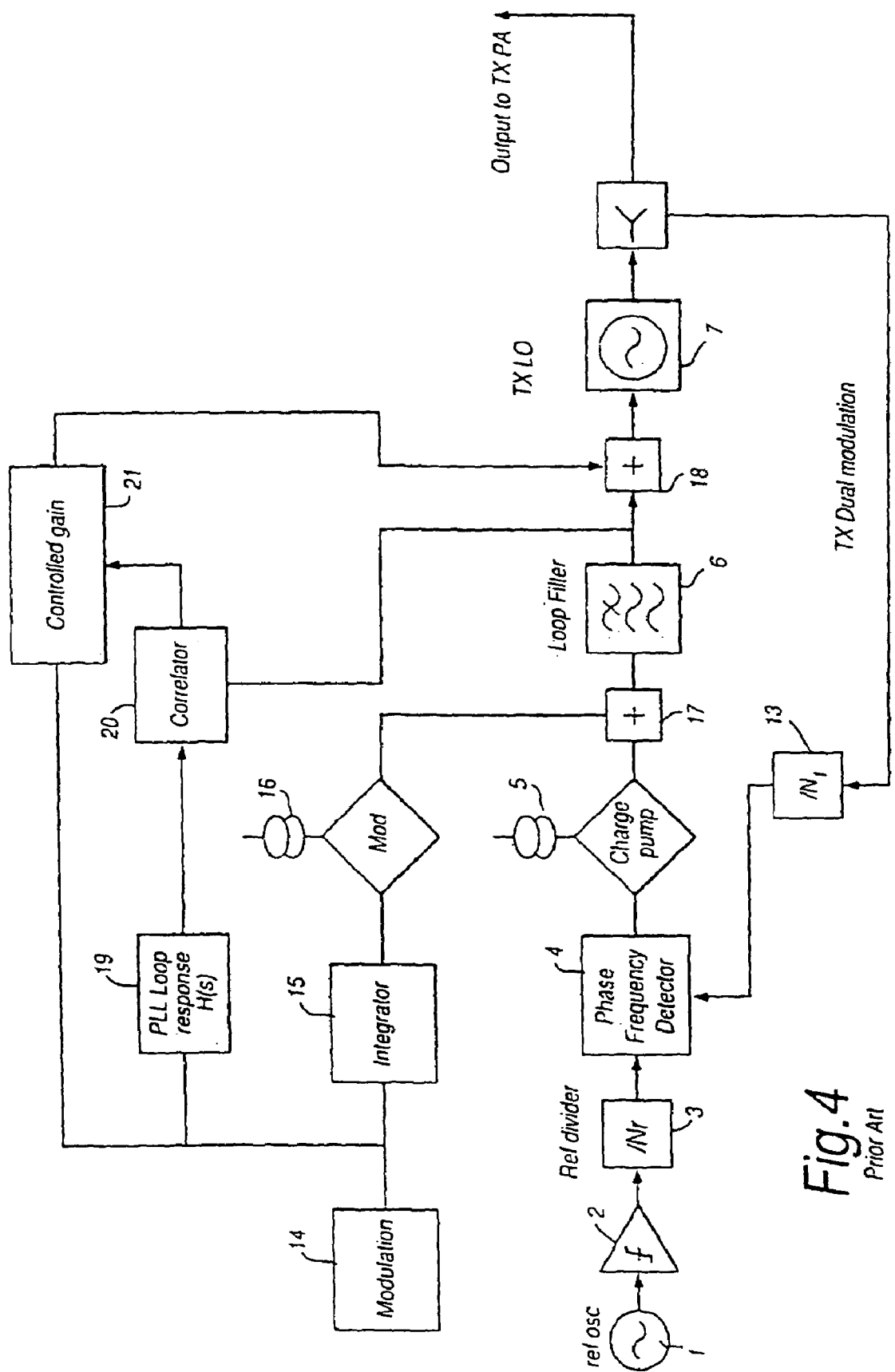
FIG. 4 is a further prior art architecture including a Delta sigma modulator.
Figure 5:
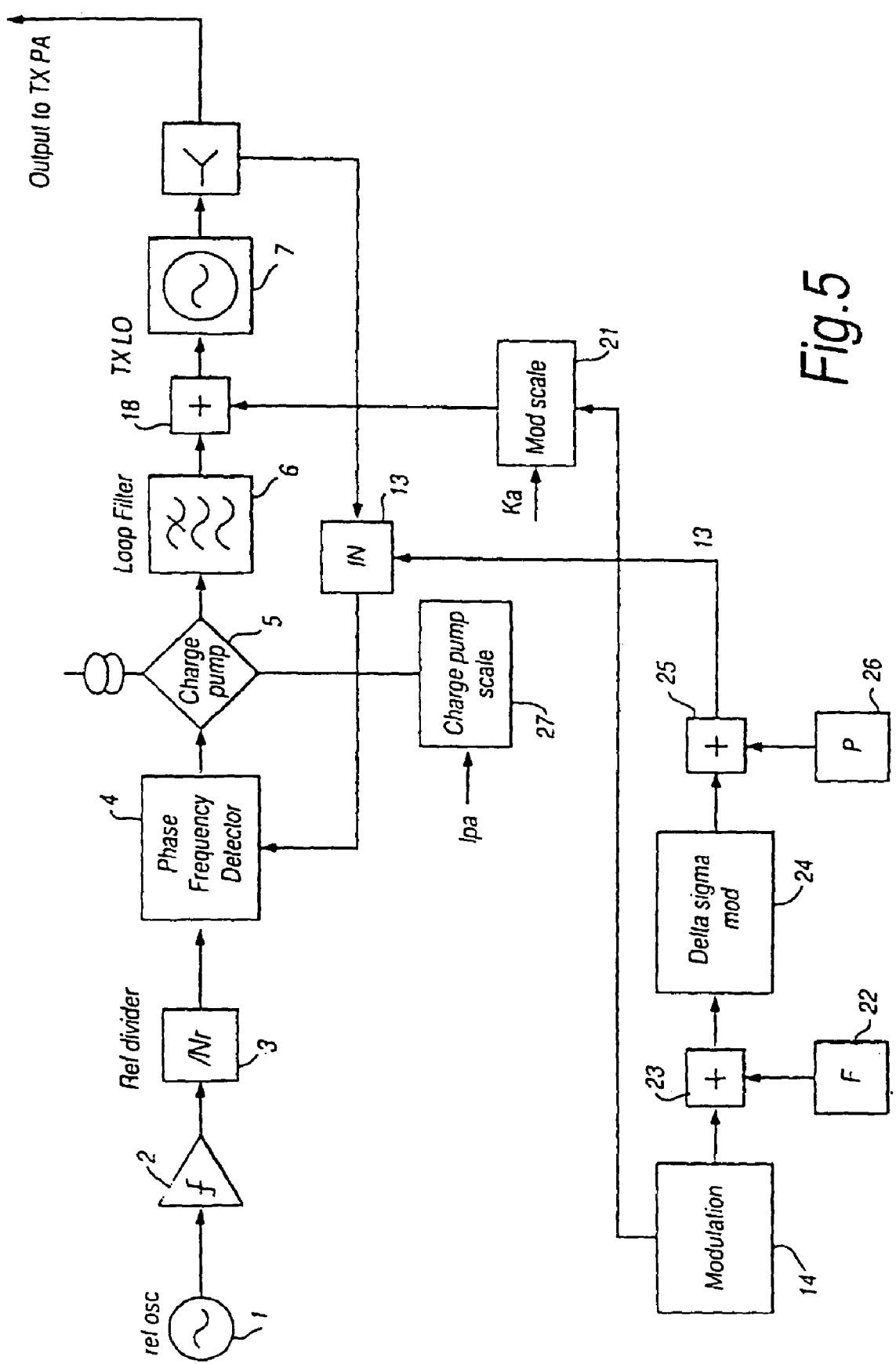
FIG. 5 is the transmitter architecture according to the preferred embodiment of the present invention.
Figure 6:
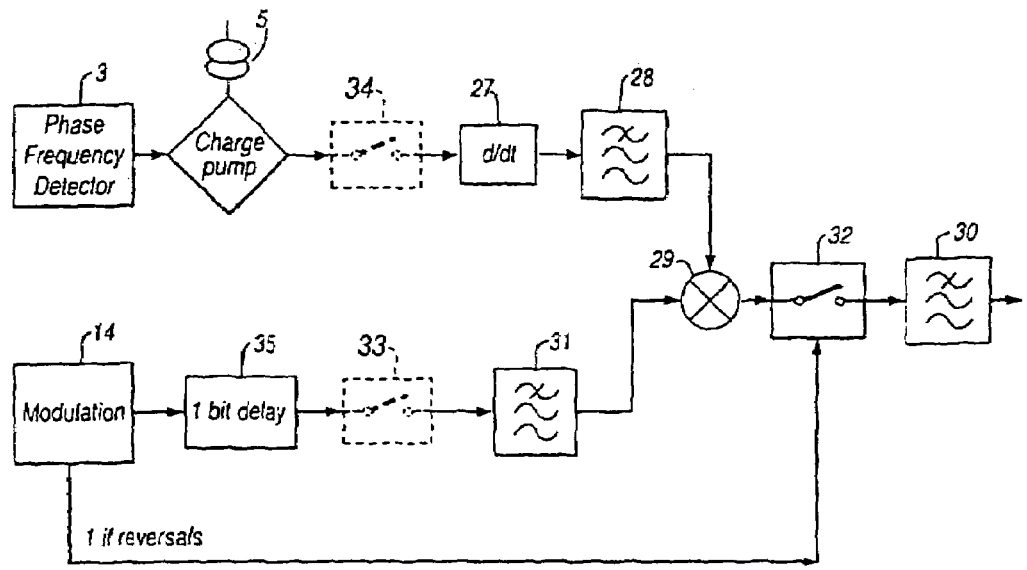
FIG. 6 is block diagram of part of the modulation correction circuit according to the preferred embodiment of the present invention.

From FIG. 5, it will be apparent that the present invention shares a common base with the prior art discussed previously with reference to FIGS. 3 and 4. More particularly, a reference oscillator 1 provides a reference frequency signal to a limiter 2 (optional) which limits the reference signal and feeds the signal to a frequency divider 3 (also optional) which then outputs the reference signal to a phase and frequency detector 4, which forms part of the phase lock loop of the present invention. The phase and frequency detector 4 receives a second input in the form of a modulated signal output from a frequency divider 13, the divide ratio of which is programmable in response to a control signal from a delta-sigma modulator 24. The frequency divider 13 corresponds to the first modulation point means of the present invention. The input to the frequency divider 13 is obtained from the output of the loop transmitter local oscillator (TX LO) 7, which is a voltage controlled oscillator. The phase and frequency detector 4 detects the relative phase difference between the reference frequency and the signal output from the frequency divider 13, and outputs a phase error signal to a charge pump 5. The charge pump S scales the signal for feeding to a loop filter 6 configured as a low pass filter, the low pass filtered signal then being fed to a summation means 18 corresponding to a second modulation point means of the present invention.

Modulation of the phase lock loop is provided from a modulation source 14 which provides frequency modulation directly to the summation means 18 via a modulation amplitude scaling means 21, and also provides frequency modulation to the frequency divider 13 by way of a delta-sigma modulator 24. More particularly, modulation output from the modulation source 14 is first summed in an adder 23 with a fractional offset constant F, the sum being fed to the delta-sigma modulator 24, the output of which is then further summed in an adder 25 with a programmable reference offset P. The output of this further summation is then fed to the frequency divider 13 as a delta-sigma control signal to provide a first modulation point on the phase lock loop.

Figure 1:
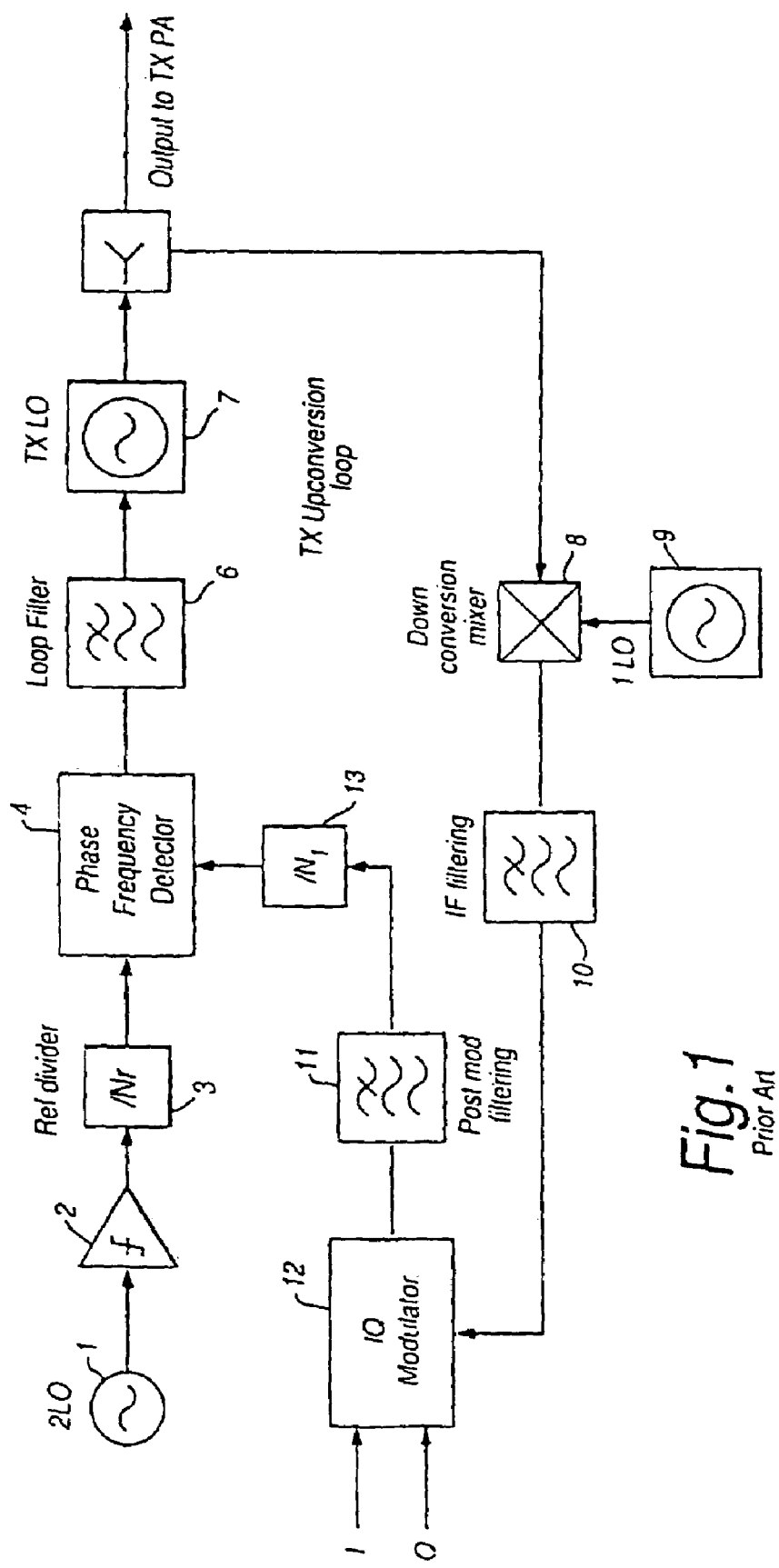
FIG. 1 is a diagram of the prior art upconversion loop architecture.
Figure 2:
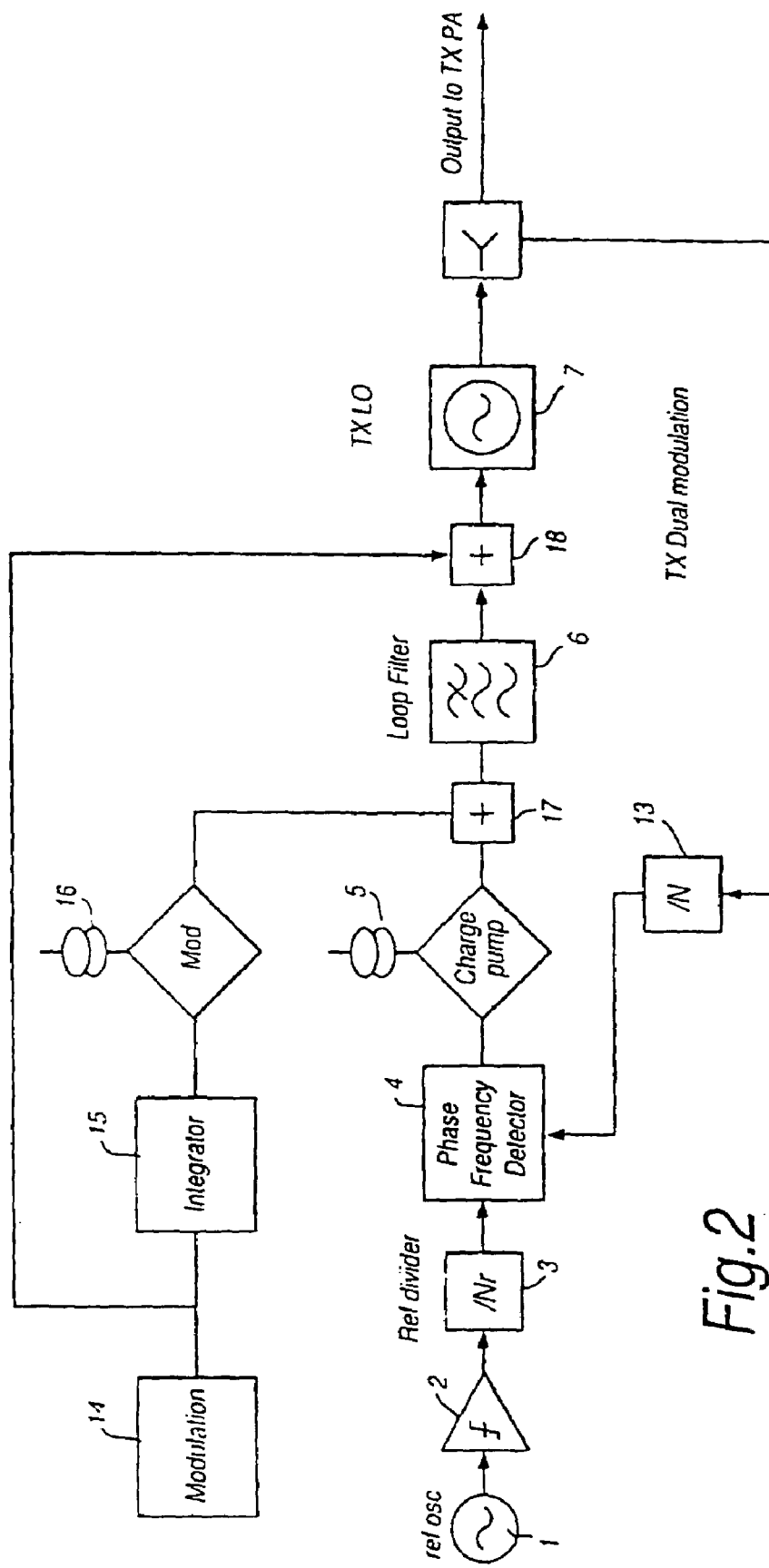
FIG. 2 is a diagram of the prior art dual-point modulation architecture.
Figure 3:
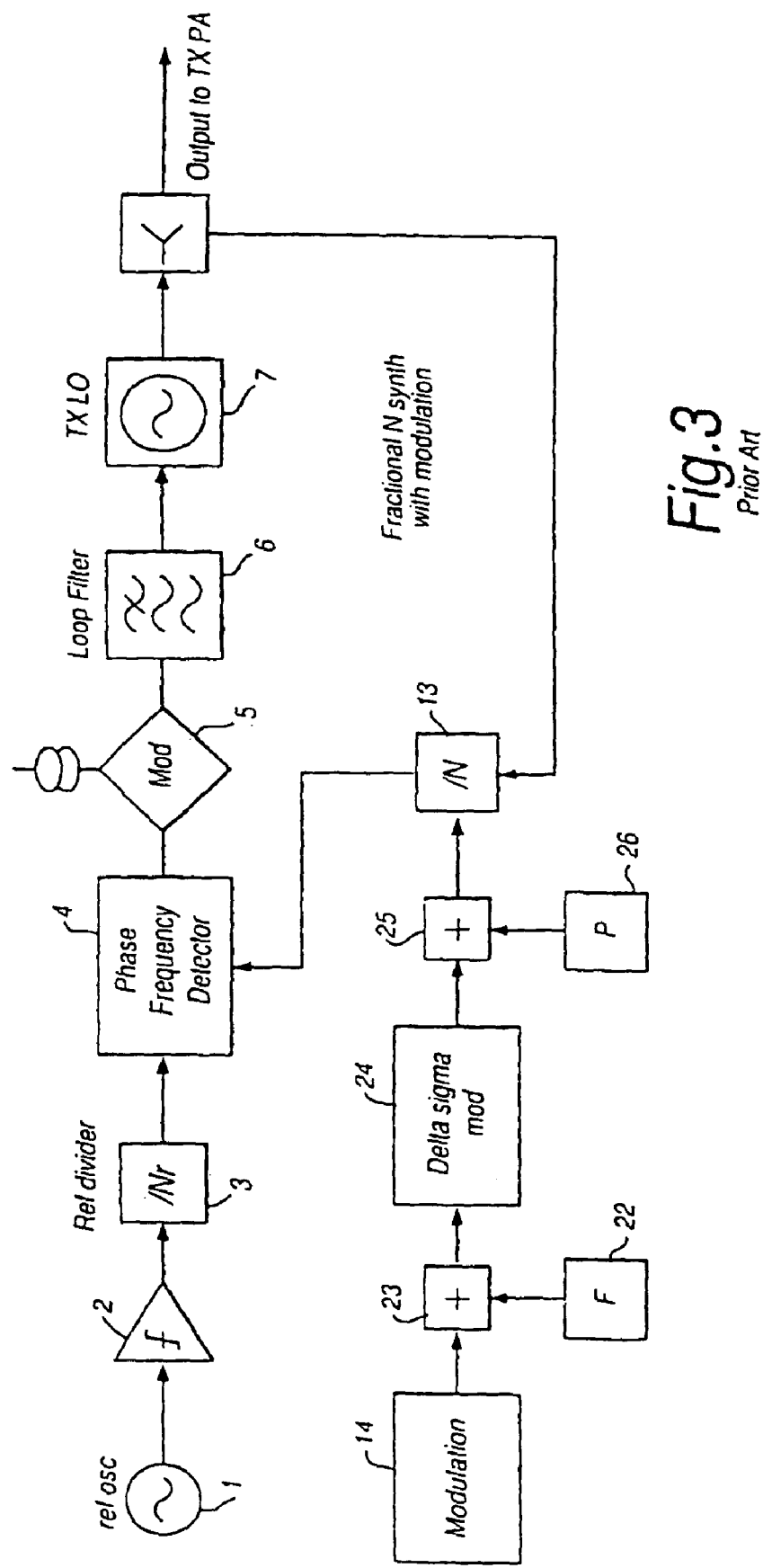
FIG. 3 is another prior art architecture for compensating for VCO gain variations.

Comparing the diagram of FIG. 5 with that of the prior art FIG. 3, it will be apparent that FIG. 5 differs in the provision of the modulation amplitude scaling means 21, and also by the provision of a charge pump scaling means 27 arranged to scale the phase error signal output from the charge pump 5. The modulation scaling means 21 is responsive to an input signal Ka to control the scaling applied, and similarly the charge pump scaling means 27 is responsive to a control input signal Ipa to control the scaling applied to the phase error signal. The signals Ka and Ipa are generated by the modulation correction circuit of the present invention, which is described in more detail below.

Following on from above, how to maintain the precision for short term (ie HF components) of the modulation and also to remove VCO gain (Kvco) spreads from the loop dynamics will now be discussed.

In order to achieve the above results, the modulation expressed as an instantaneous frequency deviation is applied simultaneously to the TX LO (7) though the scaling means (21). The charge pump current is also varied by the charge pump scaling means (27) derived by control means Ipa from the same alignment control signal. In this manner, if the Kvco is excessive, the FM deviation signal and the charge pump signal can be adjusted to compensate. Such a mechanism results in not only corrected modulation, but a PLL where the dynamics are mainly affected by changes in absolute charge pump current alone and are independent of spreads in Kvco.

There will now be a description of the derivation of the PLL alignment control voltage: this is designed with the aim of removing dependence on PLL dynamics settings. The present invention is designed to be most effective for the case in which the data rate exceeds the PLL bandwidth. By correlating the high frequencies only, the effect on PLL bandwidth is substantially reduced and the correlator will correct for errors much more rapidly than if a long sequence of modulation is required. This would reduce the requirement for storage means for the VCO gain adjustment value. In order to achieve this, the present invention is intended to embrace any means of implementing the use of a high pass filter and reversals gate to extract the high frequency content of the modulation together with the use of an oversampled delta sigma modulator to enable the high frequency content of the modulation to be applied at high precision to the PLL and the correlator, therefore maintaining the accuracy of the modulation adjustment despite the use of only a part of the total modulation input.

The following description as illustrated in FIG. (6) applies to the preferred embodiment of the present invention as an example, although alternative embodiments are possible, and will be apparent to those skilled in the art. However, within the presently preferred embodiment, in order to obtain the alignment control signals Ka and Ipa, the instantaneous frequency deviation of the modulation is applied to one input of the multiplier (29), which is implemented as a correlator, through a high pass filter (31) that removes low frequency components of the modulation. The filtering ensures that only the high frequency components of the modulation are applied to the correlation means, which are less vulnerable to the PLL dynamics. The charge pump output (5) is a representation of the phase error in the PLL. This is differentiated in differentiator (27) to convert it to a frequency error, and this simultaneously provides the function of removal of any DC offset within the loop. The output of differentiator (27) is applied at a second input of multiplier (29) by means of low pass filter (28) to remove products of the delta sigma (24) noise shaping. After the correlator multiplier (29) a gate is provided (32) that closes whenever bit reversals are present. When bit repeats are present, these are more likely to be influenced by PLL dynamics and therefore the gate is opened to prevent them reducing the effectiveness of the correlator. Alternatively, the gate can also be positioned at 33 and 34, these boxes are shown dotted to indicate these positions being optional. Furthermore, a one bit delay (35) is provided at the modulator output to aid timing of the reversals gate.

Figure 7:
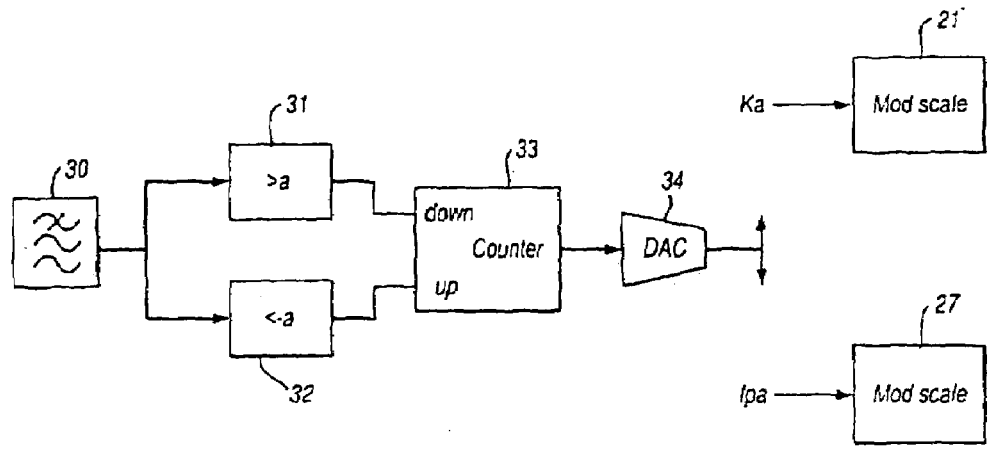
FIG. 7 is a block diagram of another part of the modulation correction circuit according to the preferred embodiment of the present invention.

All of these functions can be implemented in either digital or analogue depending upon which is the most convenient. The output of the correlator filter (30) can be applied to, for example, a pair of comparators (36, 37) as shown in FIG. 7, which either increment or decrement counter (38) depending upon the direction of the error in the correlation. This counter is only one method of implementing an integrator which can be used in the present invention, and an alternative means is the use of the standard analogue or switched capacitor integration means, the choice being set by whether the use of silicon area or startup time is to be optimised. This up/down counter is converted to an analogue voltage by means of a low resolution digital to analogue converter (DAC) (34). The DAC provides the modulation correction signal Ka to the modulation scaling means (21), and also provides the charge pump correction signal Ipa to the charge pump scaling means (27). The overall result of the control signals is to adjust the amplitude of the modulation applied to the VCO such that the modulation of the VCO and that due to the delta-sigma modulator cancel each other at the input to the phase detector. In this manner, a self-aligning PLL is obtained.

As will be apparent from the above discussion the present invention integrates various of the prior art architecture features to give a novel combination of features resulting in a novel architecture. However, in addition to the novel combination, the architecture of the present invention incorporates two additional features that are not to be found in any of the relevant prior art in the field. These two features are:

i) The use of frequency rather than phase error to drive the correction function; and ii) The use of reversals gating.

In respect of the first feature, the output of the phase detector is differentiated thus giving the instantaneous frequency error rather than phase error. This enables the removal of DC offsets from the output of the phase detector. A further advantage is that for any digital communication system, the frequency range of the modulated signal must be held within stringent limits, as to opposed to the phase which can be unlimited. The frequency error signal will therefore be of well defined amplitude. This improves the operation of the correlator.

With regards to the second feature, the use of reversals gating removes the dependency on the low frequency component of the modulation. This removes the dependency of operation on the loop BW of the PLL, thus simplify component selection. In addition this would speed the correction process, therefore minimising the requirement to store coefficients.

The net result of the present invention is a transmitter circuit architecture whose dynamics are determined by the spreads in charge pump current and loop filter values only, which would be substantially less than the VCO gain spreads, especially if the oscillator is to be integrated. The present invention therefore represents a significant improvement upon the state of the art, and provides a number of advantages thereover.

The invention claimed is:

1. A transmitter circuit means comprising:
   a phase lock loop including a phase detector means, a summation means, and a voltage controlled oscillator arranged in series, and a controllable frequency divider arranged to feedback an output of the voltage controlled oscillator to an input of the phase detector; and
   a baseband modulation source arranged to generate a modulation signal corresponding to information to be transmitted;
   a modulation correlation circuit means arranged to receive said modulation signal and to correlate said signal with residual modulation in the phase lock loop to generate one or more modulation correction signals;
   a delta-sigma modulator means arranged to receive said modulation signal and generate a delta-sigma control signal therefrom; and
   a modulation amplitude scaling means arranged to receive the modulation signal and the modulation correction signals and to scale the amplitude of the modulation signal in response thereto;
   wherein the scaled modulation signal is applied to the phase lock loop at the summation means in order to modulate the voltage controlled oscillator to produce a modulated RF output signal; and
   the delta-sigma control signal is applied to the controllable frequency divider in order to control the divide ratio thereof whereby the controllable frequency divider acts to substantially remove the modulation from the modulated RF output signal at the input to the phase detector.

2. A transmitter circuit means according to claim 1, further comprising a reference frequency source arranged to generate a reference frequency signal, said phase detector means being arranged to receive said reference frequency signal at a second input and to generate a phase error signal corresponding to the relative phase error between the reference frequency signal and the output RF signal.

3. A transmitter circuit means according to claim 2, wherein said phase detector means further comprises:
   a phase error detection means arranged to detect the relative phases of said reference frequency signal and said output RF signal; and
   a charge pump arranged to generate said phase error signal in response to the detected phase error.

4. A transmitter circuit means according to claim 3, further comprising a charge pump scaling means arranged to control the charge pump to scale the amplitude of the phase error signal generated therein, said charge pump scaling means being responsive to a charge pump correction signal generated by said modulation correlation circuit means.

5. A transmitter circuit means according to claims 2, further comprising a low pass loop filter arranged to receive said phase error signal, and to output a filtered phase error signal to said summation means as the input to said means.

6. A transmitter circuit means according to claim 1, and further comprising:
   at least one storage means arranged to store a programmable reference multiplier constant P and a programmable fractional frequency offset constant F;
   a first adder arranged to stun the modulation signal and the constant F, and output the result to the delta-sigma modulator; and a second adder arranged to sum the output of the delta-sigma modulator and the constant P to give the delta-sigma control signal.

7. A transmitter circuit means according to claim 1, wherein said modulation correlation circuit means further comprises:
   a differentiator arranged to receive the phase error signal and to differentiate said signal to give a frequency deviation signal corresponding to the residual modulation in the phase lock loop;
   a high pass filter arranged to receive the modulation signal from said baseband modulation source and to filter said modulation signal to remove any low frequency components;
   a correlator arranged to receive said frequency deviation signal and said filtered modulation signal, and to output a master control signal; and
   control signal generation means arranged to receive said master control signal and to generate at least said modulation correction signals in response thereto.

8. A transmitter circuit means according to claim 7, wherein said control signal generation means also generates said charge jump correction signal in response to said master control signal.

9. A transmitter circuit means according to claim 7, wherein said modulation correlation circuit means further comprises:
   a delay-means arranged to apply a 1-bit delay to said modulation signal output from said baseband modulation source prior to being fed to said high pass filter; and
   a switch means arranged between said correlator and said control signal generation means, said switch means being further arranged to be operable in response to a reversal signal output from said baseband modulation source, wherein said switch means opens when said reversal signal indicates that a bit repeat has occurred and closes when said reversal signal indicates that a bit reversal has occurred.

10. A transmitter circuit means according to claim 7, wherein said modulation correlation circuit further comprises a delay means arranged to apply a 1-bit delay to said modulation signal output from said baseband modulation source means prior to being fed to said high pass filter;
   a first switch means arranged between said phase detector means and said differentiator, and
   a second switch means arranged between the output of said delay means and the input of said high pass filter, wherein said first and second switch means are further arranged to be operable in response to a reversal signal output from said baseband modulation source, wherein said first and second switch means open when said reversal signal indicates that a bit repeat has occurred and closes when said reversal signal indicates that a bit reversal has occurred.

11. A transmitter circuit means according to claim 7, wherein said modulation correlation circuit means further comprises a low pass filter arranged between the output of said differentiator and the input of said correlator to low pass filter said frequency deviation signal.

12. A transmitter circuit means according to claim 7, wherein said modulation correlation circuit comprises a second low pass filter arranged at the input to said control signal generation means, to low pass filter said master control signal.

13. A transmitter circuit means according to claim 7, wherein said control signal generation means comprises:
   a first comparator arranged to compare the master control signal with a reference value a, and to output a fast result signal when said master control signal is greater than (+a);
   a second comparator arranged to compare the master control signal with said reference value a, and to output a second result signal when said master control signal is less than (−a);
   a counter arranged to be decremented in response to said first result signal and to be incremented in response to said second result signal; and
   a digital to analogue converter (DAC), arranged to generate an analogue signal representation of the value of said counter;
   wherein said modulation correction signal is derived from the analogue output of said DAC.

14. A transmitter circuit means according to claim 13, wherein said charge pump correction signal is derived from the output of said DAC.

15. A transmitter circuit means according to claim 7, wherein said high pass filter, said low pass filter, and said second low pass filter are each any one of a digital, analogue, or switched capacitor filter respectively.

16. A transmitter circuit means according to claim 1 wherein said transmitter circuit means provides a phase modulated output.

17. A method for generating a modulated RF output signal in a phase lock loop including a phase detector means, a summation means and a voltage controlled oscillator arranged in series and a controllable frequency divider arranged to feedback an output to the voltage controlled oscillator to an input of the phase detector, the method comprising the steps of:
   generating a modulation signal corresponding to information to be transmitted; and characterized by further comprising the steps of:
   generating a delta-sigma control signal from the modulation signal in a delta-sigma modulator;
   applying the modulation signal to the summation means to modulate the voltage controlled oscillator to produce the modulated RF output signal as the output of said oscillator;
   applying the delta-sigma control signal to the controllable frequency divider in order to control the frequency divide ratio thereof;
   frequency dividing the modulated RF output signal in the controllable frequency divider in accordance with the frequency divide ratio of the divider;
   correlating residual modulation in the phase lock loop with the modulation signal, the result of the correlation being used to generate a modulation correction signal; and
   scaling the modulation signal applied to the summation means in response to the modulation correction signal;
   wherein said step of frequency dividing substantially removes the modulation from the RF output signal at the input of the phase detector.

* * * * *

UNITED STATES PATENT AND TRADEMARK OFFICE
CERTIFICATE OF CORRECTION

PATENT NO.       : 7,120,396 B2                                          Page 1 of 1
APPLICATION NO.  : 10/664164
DATED            : October 10, 2006
INVENTOR(S)      : Martin Wilson It is certified that error appears in the above-identified patent and that said Letters Patent is hereby corrected as shown below:

On Title Page item 56
After the section "Related U.S. Application Data" and before the section "Intl. Cl.",
insert: -- Foreign Application Priority Data
September 22, 1999     (GB).......................9922469.3
September 21, 2000     (WO).....................PCT/GB00/03619 --

Item 65 "Prior Publication Data", after the last line, insert:
-- WO 01/22675 A1     March 29, 2001 --

Col. 2, line 31, after "the transmit signal which," change "tun" to --turn-- .

Col. 7, line 38, change "therebetween in" to --therebetween. In--.

Col. 8, line 67, change "The charge pump S" to --The charge pump 5--.

Col. 12, line 12, after "arranged to," change "stun" to --sum--.

Signed and Sealed this

Twelfth Day of June, 2007

JON W. DUDAS
*Director of the United States Patent and Trademark Office*